United States Patent [19]

Twerdochlib

[11] Patent Number: 5,087,909
[45] Date of Patent: Feb. 11, 1992

[54] METHOD AND APPARATUS FOR RADIO FREQUENCY SIGNAL DETECTION

[75] Inventor: Michael Twerdochlib, Ovideo, Fla.

[73] Assignee: Westinghouse Electric Corp., Pittsburgh, Pa.

[21] Appl. No.: 395,633

[22] Filed: Aug. 18, 1989

[51] Int. Cl.$^5$ .................................................. G08B 21/00
[52] U.S. Cl. ...................................... 340/635; 340/679; 324/158 MG; 324/555
[58] Field of Search ............... 340/635, 679, 682, 661; 324/158 MG, 555; 361/31; 318/490

[56] References Cited

U.S. PATENT DOCUMENTS

| | | |
|---|---|---|
| 2,951,166 | 8/1960 | Swanson . |
| 3,188,620 | 6/1965 | MacCallum . |
| 3,831,160 | 8/1974 | Cronin et al. . |
| 4,097,794 | 6/1978 | Burrus, Jr. . |
| 4,147,982 | 4/1979 | Emery .................. 340/647 |
| 4,156,846 | 5/1979 | Harrold et al. . |
| 4,230,961 | 10/1980 | Calfo et al. . |
| 4,377,784 | 3/1983 | Saito et al. .............. 340/648 X |
| 4,446,426 | 5/1984 | Emery et al. .............. 324/555 |
| 4,502,046 | 2/1985 | Wonn et al. ............... 340/682 |

FOREIGN PATENT DOCUMENTS 136983 7/1947 Australia .

*Primary Examiner*—Jin F. Ng
*Assistant Examiner*—Jeffery A. Hofsass

[57] ABSTRACT

A method and apparatus which indicates an actual arc occurrence only if a voltage or current of a generator neutral lead exceeds a specified threshold amplitude, and is followed by a second RF signal again exceeding the threshold amplitude and occurring within a specified time period.

6 Claims, 4 Drawing Sheets

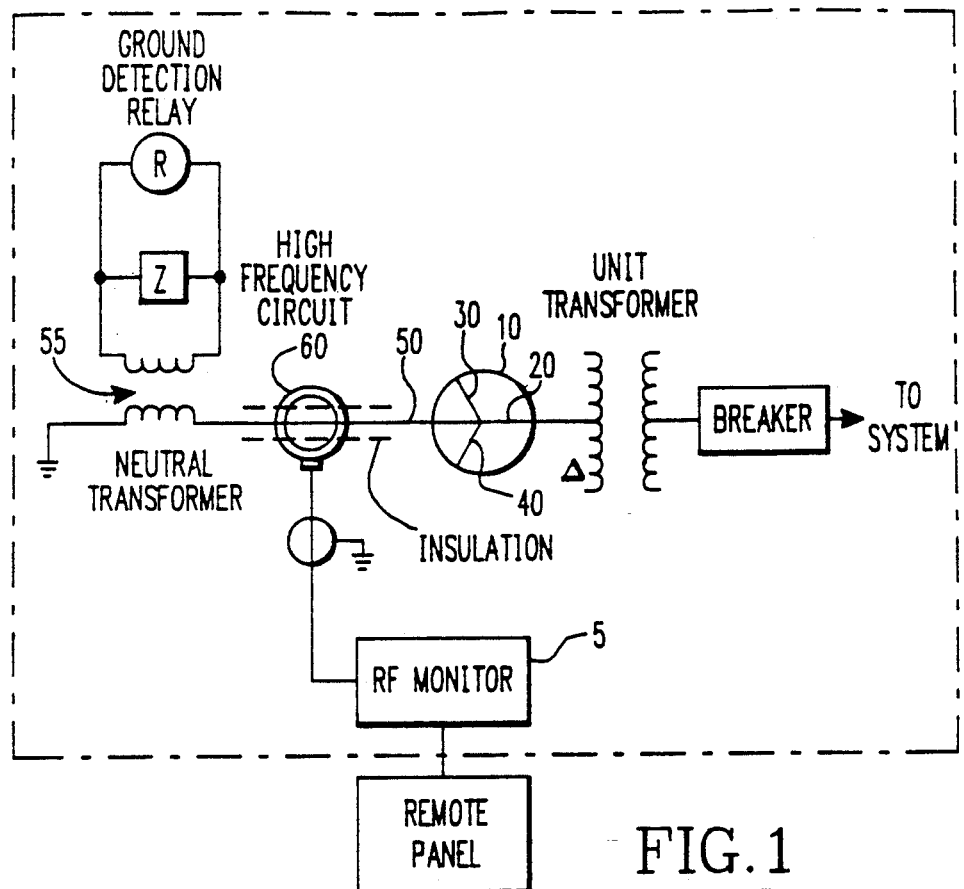
FIG. 1
PRIOR ART
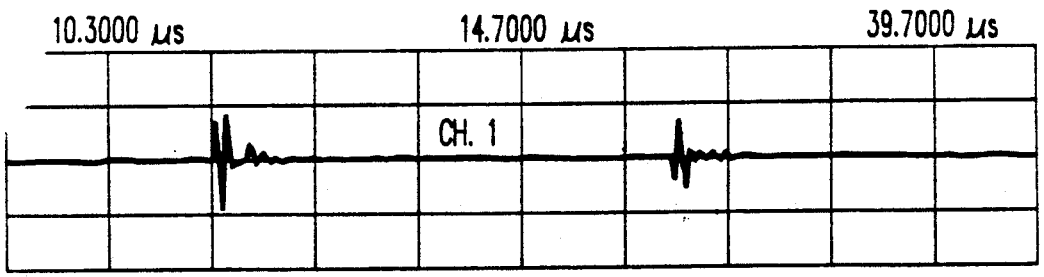
ISOLATED PHASE BUS NEUTRAL    FIG. 2A
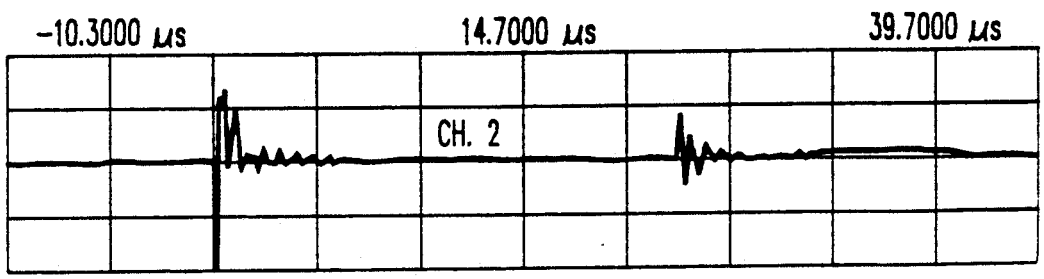
ISOLATED PHASE BUS NEUTRAL    FIG. 2B

METHOD AND APPARATUS FOR RADIO FREQUENCY SIGNAL DETECTION

BACKGROUND OF THE INVENTION

1. Field of the Invention

This invention relates to a method and apparatus for detection of fault conditions and, more particularly, to a method and apparatus for detecting radio frequency signals in a turbine generator which discriminates between false fault signals (for example, noise signals) and real fault signals (for example, signals generated by arcing).

2. Description of the Related Art

A turbine generator generally has six leads. For example, a three-phase generator has three "hot" phase leads and three neutral leads connected to ground. A single neutral lead is thus common to all three phases A conventional radio frequency monitor (RFM) senses all RF signals from the neutral lead. If a specified threshold level is sensed as a result of an RF signal, the RFM issues an alarm.

RF signals can occur as a result of at least three conditions. Very short duration pulses of low voltage or current occur due to partial discharges within the generator and isophase ducts. These short duration pulses occur more or less at a constant rate, and are not indicative of a problem within the generator i.e., they are "false" signals. However, conventional RFM's will sense the short duration pulses and add their contribution to the RFM level, falsely indicating a generator malfunction. This is one type of false signal.

A second false signal occurs due to external electrical switching circuits containing SCR's, Triacs, etc. Signals generated from the switching circuits are typically very large spikes (high voltage or current) which may or may not be synchronous. They usually occur intermittently, but with conventional RFM's they are easily confused with, and interpreted as, an arcing event. These false signals may also incorrectly contribute to an RFM alarm.

Real fault signals are generated by arcs. These arcs may be internal or external to the generator and typically are associated with broken winding strands and dirty or misadjusted shaft grounding brushes. Sensing of an arc indicates a possible problem in the generator system.

Conventional RFM's cannot discriminate between the false signals and the real signals, resulting in false alarms and a reduced ability to detect arcing events.

SUMMARY OF THE INVENTION

It is an object of the present invention to provide a method and apparatus for RF detection which discriminates between false RF signals and real RF signals.

Another object of the present invention is to provide a method and apparatus for detecting radio frequency signals which trips an alarm if RF signals generated by arcs occur, but which will not trip an alarm if RF "noise", for example, short duration pulses from partial discharges within the generator or signals from external electrical switching circuits containing SCR's or triacs, occurs.

According to the present invention, there is provided a method and apparatus which indicates an actual arc occurrence only if a voltage or current spike of a generator neutral lead exceeds a specified threshold amplitude, and is followed by a second or possible third or fourth RF signal again exceeding the threshold amplitude and occurring within a specified time period.

These, together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic drawing of a conventional generator system including an RFM;

FIGS. 2A and 2B are graphs of radio frequency signals generated due to partial discharges;

DESCRIPTION OF THE PREFERRED EMBODIMENTS

Figure 3:
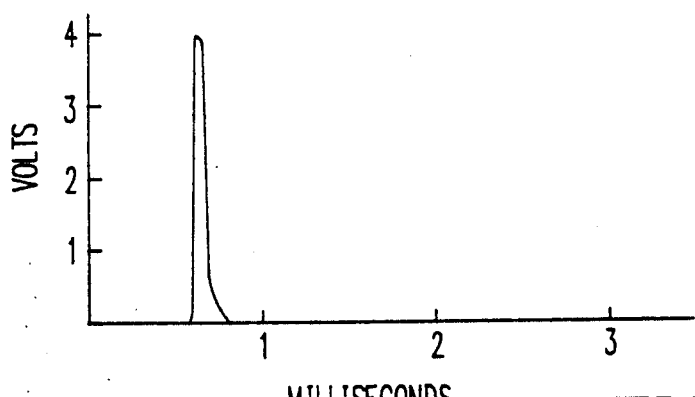
FIG. 3 is a graph of radio frequency signals generated due to external electrical switching circuits.

FIG. 1 shows a conventional generator system including an RFM 5 for detecting radio frequency signals as described in U.S. Pat. No. 4,446,426. A three-phase generator 10 includes three "hot" phase leads, phase A 20, phase B 30 and phase C 40. A neutral lead 50 is connected to ground, with the ground being common to all three phases. The RF signals are sensed from, or "picked off", the neutral lead near a neutral transformer 55. The neutral transformer is, for example, a transformer that picks up large voltage spikes occurring when the phases are imbalanced and trips the generator. The radio frequency is picked off the neutral transformer with, for example, a conventional current transformer 60. A capacitor (voltage) coupler can also be used for sensing the radio frequency signal. The radio frequency signal is discerned by the radio frequency monitor 5. Standard radio frequency monitors do not discriminate between real signals and false signals.

Radio frequency signals on the neutral lead 50 due to partial discharges within the generator 10 and isophase bus (for example, phase C 40) are typically very short ringing pulse waveforms of about 50 nanoseconds in duration, as shown in FIGS. 2A and 2B, respectively.

Signals generated due to external electrical switching circuits containing SCR's and triacs are less numerous than those generated by the partial discharges shown in FIG. 2 but may be much higher in magnitude, i.e., a higher voltage, as shown in FIG. 3.

Figure 4:
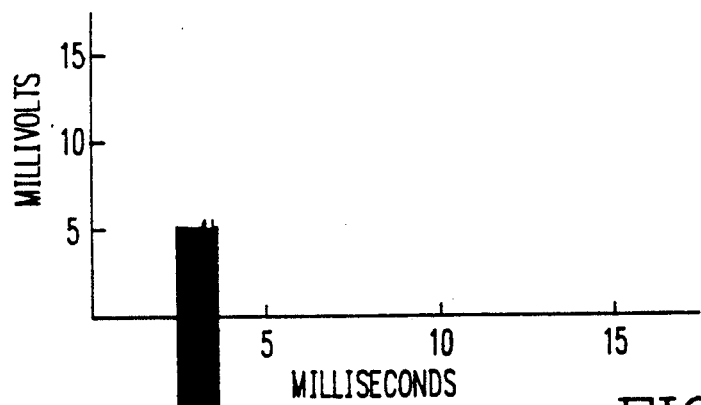
FIG. 4 is a graph of radio frequency signals generated due to arcing.

Real signals, that is, those generated by arcs, comprise a series of many dense spikes confined to an envelope many tens of microseconds in length, for example, 100 microseconds, as shown in FIG. 4.

According to the method and apparatus of the present invention, the unwanted pulse signals are eliminated from the signal prior to input of the signal to the RFM 5. Two conditions are established which must be met before passing the RF signals to the RFM. First, the voltage spike sensed at the generator neutral lead 50 must exceed a specified threshold voltage, for example, 4 millivolts. If this condition is met, the signal at the generator neutral lead must again exceed the threshold voltage as a rising edge within a specified time period, for example, 100 microseconds. If these two conditions are met, both signals are passed on to the RFM. Conversely, if either of these conditions are not met, the signal is not passed on to the RFM. Using this screening technique, the above-mentioned false signals are eliminated from the input signal to the RFM. Of course current spikes can also be compared against a current threshold.

Figure 5:
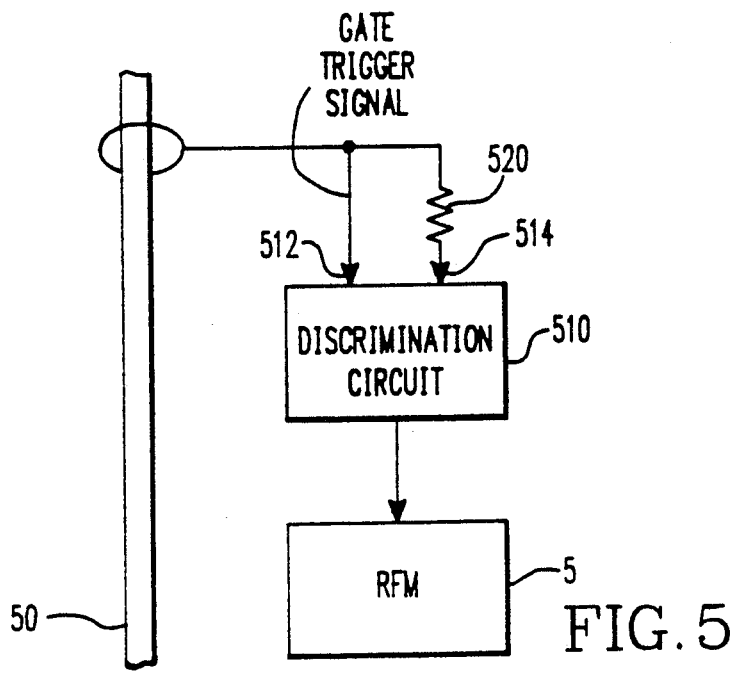
FIG. 5 is a schematic drawing of an analog preprocessing gate circuit of the present invention.

The false signal elimination can be implemented using an analog preprocessing gate circuit or a digital preprocessing gate circuit. FIG. 5 is a schematic drawing of an analog preprocessing gate circuit according to the present invention. An RF signal on the neutral lead 50 is input to a discrimination circuit 510 at a nondelayed input 512. A delayed signal is input to discrimination circuit 510 at a delayed input 514. A conventional electronic delay line 520 delays the input of the radio frequency signal to the delayed input 514 so that the delayed signal can be transmitted to the RFM if analysis of the nondelayed signal is found to satisfy the previously mentioned criteria. The electronic delay line 520 can comprise any standard delay circuit, for example, a coiled length of coaxial cable or an acoustical electronic delay circuit. In a preferred embodiment, the desired delay time is 100 microseconds.

Figure 6:
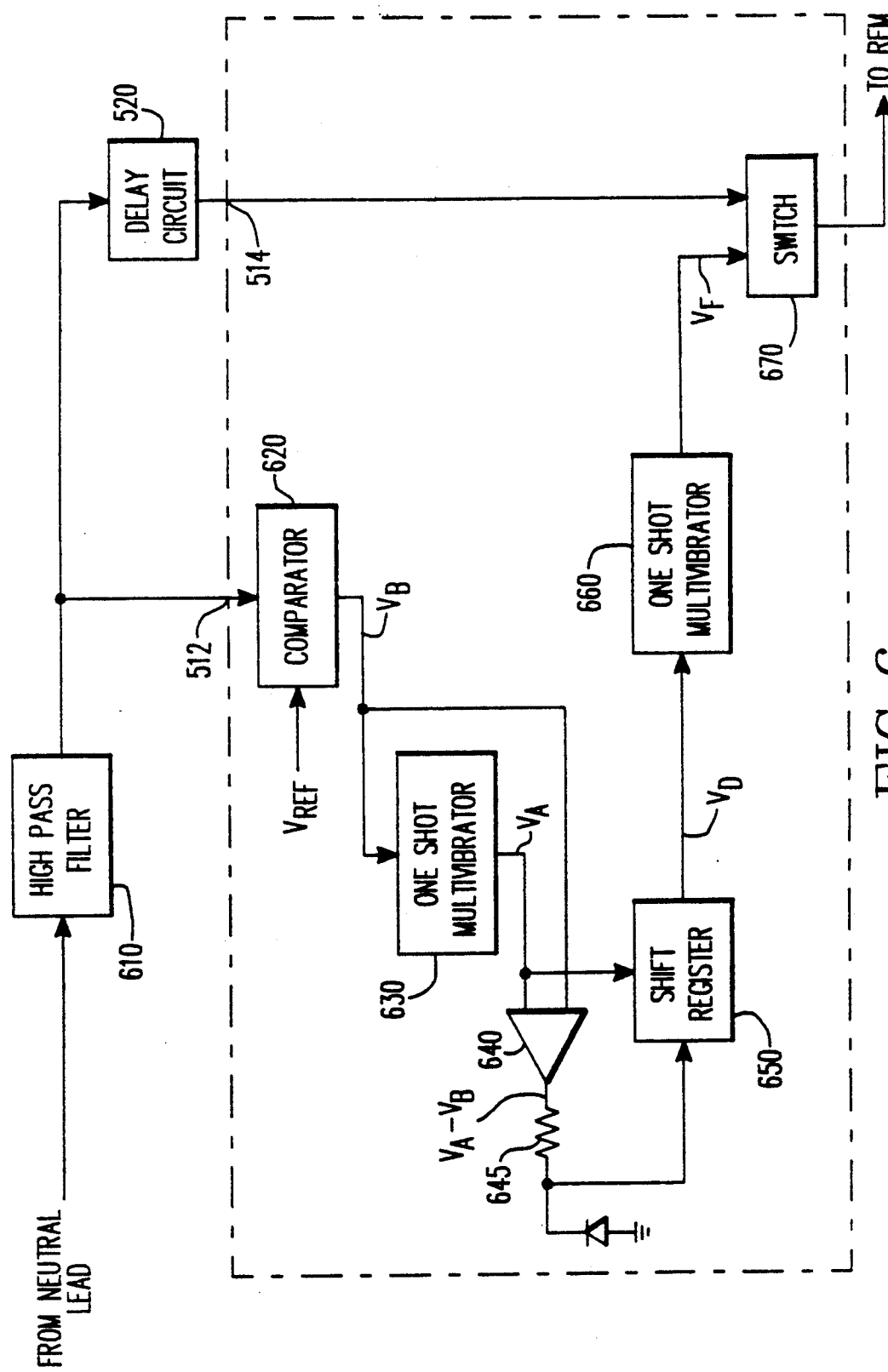
FIG. 6 is a diagram of a discrimination circuit of the present invention.

An example of an arrangement for discrimination circuit 510 is shown in FIG. 6. The RF signal from the neutral lead 50 is input to a high pass filter 610. High pass filter 610 removes an 180 Hz component on the neutral lead. The RF signal is then input to a comparator 620 and to delay circuit 520. If the voltage level of the RF signal input to comparator 620 exceeds $V_{REF}$, comparator 610 outputs a logical "1". The output of comparator 620 remains a logical "1" until the RF signal equals or drops below $V_{REF}$.

The output of comparator 620 is input to a monostable multivibrator 630, for example, a 100 microsecond 1 shot. Multivibrator 630 is triggered by a rising edge of the output $V_B$ of comparator 620.

The output of comparator 620 ($V_B$) is also input to a differential amplifier 640. The output $V_A$ of multivibrator 630 is also input to differential amplifier 640. Differential amplifier 640 subtracts $V_A$ from $V_B$ and inputs the results of the subtraction (a 1 or 0) to a serial shift register 650. The output $V_A$ from multivibrator 630 is also input to shift register 650 (a more detailed description of shift register 650 is set forth below).

Serial shift register 650 outputs $V_D$ to one shot multivibrator 660, for example, a 100 microsecond one shot. Multivibrator 660 is triggered by a falling edge of signal $V_D$. Multivibrator 660 outputs $V_E$ to switch 670. Signal $V_E$ a gate signal which triggers switch 670. Switch 670 passes the RF signal delayed by delay circuit 520 when gate signal $V_E$ is high, sending the delayed radio frequency signal to the RFM.

Figure 7:
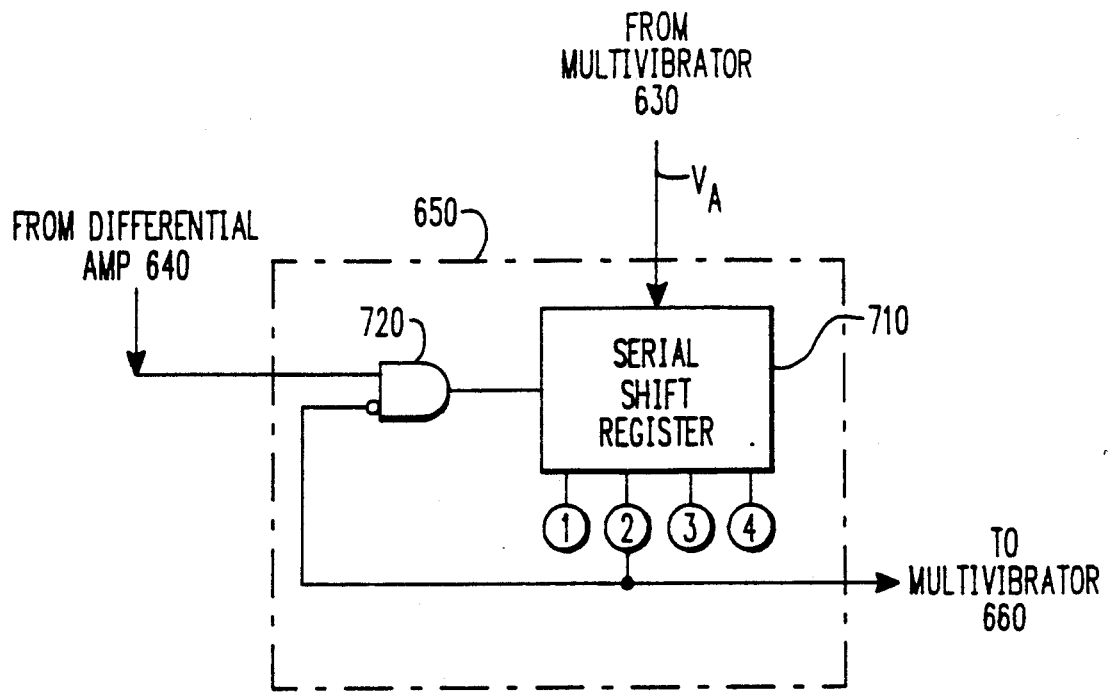
FIG. 7 is a block diagram of an example of the shift FIG. 6.

FIG. 7 is a block diagram of shift register 650 of FIG. 6. Serial shift register 710 is cleared upon receipt of a falling pulse from multivibrator 630 and is enabled when it receives a high signal. AND gate 720 receives the output signal from differential amplifier 640 and the output from serial shift register 710. The output from serial shift register 710 is inverted prior to being input to AND gate 720.

During operation, the signal from the neutral lead of the generator passes through high pass filter 610 which removes the 180 hertz component on the neutral lead. This signal is then input to comparator 620 and to delay circuit 520. The RF signal delayed by delay circuit 520 is sent to switch 670, which will pass the delayed signal to the RFM when the switch 670 is gated open.

The RF signal input to comparator 620 is compared with $V_{REF}$. If the RF signal input to comparator 620 is less than or equal to $V_{REF}$, comparator 620 outputs a logical "0". If the signal input to comparator 620 exceeds $V_{REF}$, the comparator 620 outputs a logical "1", triggering multivibrator 630 on the rising edge of the logical "1".

Upon receipt of the logical "1" from comparator 620, multivibrator 630 outputs a logical "1" to differential amplifier 640. Since the output $V_B$ of comparator 620 is also directly input to differential amplifier 640, when $V_A$ is a "1" (indicating the occurrence of a rising edge of $V_B$) and $V_B$ is a "0" (when $V_B$ drops below $V_{REF}$ within the time period of the multivibrator 630, in this example, 100 micorseconds), differential amplifier 640 will output a "1" ($V_A - V_B = 1$). This is sent to shift register 650.

The falling signal from the one shot multivibrator 630 clears the serial shift register 710. When serial shift register 710 is cleared by the falling edge of $V_A$, all outputs of serial shift register 710 are low and AND gate 720 will pass all pulses from differential amplifier 640 to serial shift register 710. The first pulse through AND gate 720 causes output 1 of serial shift register 710 to go high. The second pulse through AND gate 720 causes output number 2 of serial shift register 710 to go high, preventing any further pulses from passing through gate 720. The high output from output 2 of serial shift register 710 also triggers one shot multivibrator 660, which gates switch 670 open. This passes the delayed signal from delay circuit 520 to the RFM. This signal will continue to be passed to the RFM until the voltage of the RF signal drops below the threshold voltage and when an RF pulse meeting the threshold voltage does not occur within the predetermined time frame (100 microseconds in this example).

The shift register 650 can be rewired so that the output of serial shift register 710 is from outputs 3 or 4, in which case 3 or 4 pulses respectively, would be required before the output of shift register 650 goes high.

Figure 8:
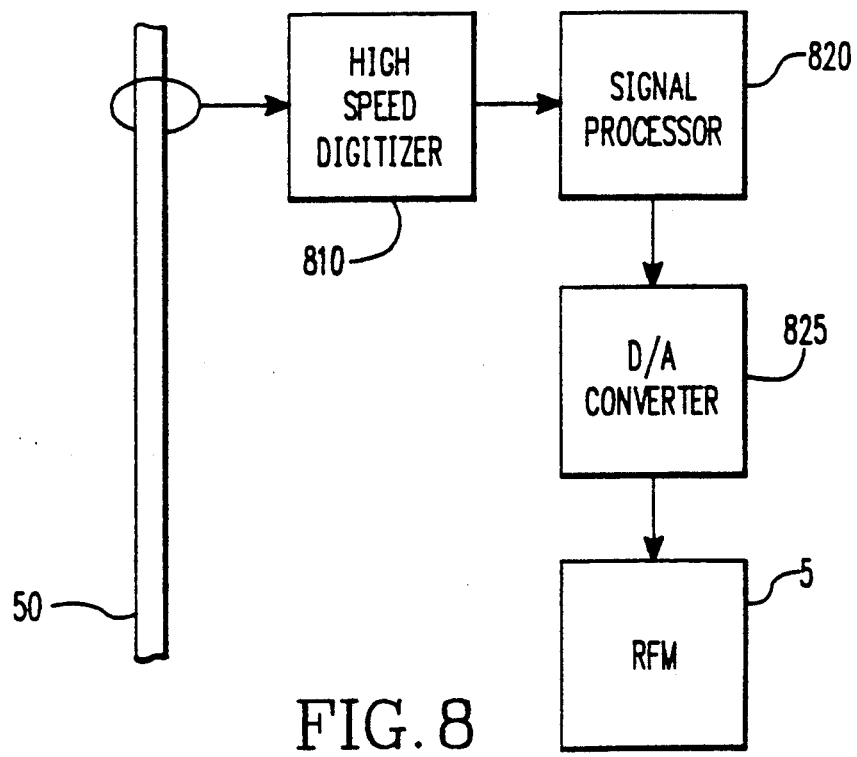
FIG. 8 is a block diagram of a digital preprocessing circuit of the present invention.

FIG. 8 shows a digital preprocessing gate circuit for preprocessing the RF signals according to the present invention. In FIG. 8, a high speed digitizer 810 is shown which can comprise, for example, a very fast A to D converter. An example of such a digitizer is model BT-208 eight-bit flash converter operating at 20 MHz available from Brooktree Corporation, San Diego, Calif. Digitizer 810 converts the analog signal from the neutral lead into digital signals which are processed by a signal processor 820. Signal processor 820 may comprise, for example, a computer. Signal processor 820 includes software programming which performs the screening function by detecting the existence of, or lack of existence of the first and second conditions previously discussed. A suitable program can be provided by one of ordinary skill in the art.

The signal procesor 820 assumes the role of discrimination circuit 510. If the RF signal meets the criteria of the two conditions, the signal is output to the RFM 5 after having been converted back to analog form by digital-to-analog converter 825. Alternatively, the RF level can be calculated digitally by the processor and the RFM replaced by the digital signal processor 820.

With the embodiment of FIG. 8, the software programming enables the signal processor 820 to read the input, analyze the signal, decide whether or not to output the signal to the RFM, or to "throw out" the signal as a false signal, etc. Thus, changing the analysis criteria, for example, the specified threshold voltage or the specified time period of the first and second conditions, is a simple matter performed by modifying the software program to facilitate these changes.

The technique and apparatus disclosed herein requires no modification of the existing RFM's. The apparatus and method is applied prior to the input to the RFM, making modification of existing systems relatively easy.

The many features and advantages of the invention are apparent from the detailed specification, and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly all suitable modifications and equivalents may be reported to, falling within the scope of the invention.

What is claimed is:

1. A method for detecting an actual fault condition occurring in a generator, comprising the steps of:
   (a) sensing an RF signal from the generator;
   (b) discriminating between false fault signals and actual fault signals, comprising the steps of:
      (b1) detecting a level of a first occurrence of the sensed RF signal;
      (b2) detecting a second occurrence of the sensed RF signal; and
      (b3) allowing output of an actual fault signal only if the level of the first occurrence of the RF signal exceeds a predetermined level and the second occurrence of the RF signal is within a predetermined time period;
   (c) outputting only the actual fault signals; and
   (d) indicating the existence of the actual fault condition by testing the actual fault signals against a threshold.

2. An apparatus for detecting an actual fault condition occurring in a generator, comprising:
   sensing means for sensing an RF signal from the generator;
   discriminating means for discriminating between false fault signals and actual fault signals within the RF signal, said discriminating means comprising:
      first detecting means for detecting a level of a first occurrence of the sensed RF signal; and
      second detecting means for detecting a second occurrence of the sensed RF signal; and
      output means for outputting an actual fault signal only if the level of the first occurrence of the RF signal exceeds a predetermined level and if the second occurrence of the RF signal occurs within a predetermined time period; and
   indicating means for indicating the existence of the actual fault condition by testing the actual fault signal against a threshold.

3. An apparatus for detecting an actual fault condition occurring in a generator, comprising:
   sensing means for sensing an RF signal from the generator;
   discriminating means for discriminating between false fault signals and actual fault signals within the RF signal and passing the actual fault signals, said discriminating means comprising:
      actual input means for receiving a first RF signal directly from a neutral lead of the generator;
      delayed input means for receiving a delayed second RF signal from the neutral lead; and
      comparison means for comparing the received first RF signal and comparing said delayed second RF signal and outputting the actual fault signal when the received first RF signal exceeds a predetermined level and the delayed second RF signal occurs within a predetermined time period; and
   detecting means for comparing the actual fault signal to a threshold and producing an alarm indicating the actual fault condition when the threshold is exceeded.

4. A method for eliminating false fault signals, comprising the steps of:
   (a) sensing an RF signal;
   (b) discriminating between false fault signals and actual fault signals, comprising the steps of:
      (b1) detecting a level of a first occurrence of the sensed RF signal;
      (b2) detecting a second occurrence of the sensed RF signal; and
      (b3) allowing output of an actual fault signal only if the level of the first occurrence of the RF signal exceeds a predetermined level and the second occurrence of the RF signals occurs within a predetermined time period; and
   (c) outputting only the actual fault signals; and
   (d) testing the actual fault signals against a threshold and producing an alarm when the threshold is exceeded.

5. A signal preprocessor for eliminating false fault signals, comprising:
   sensing means for sensing an RF signal;
   discriminating means for discriminating between false fault signals and actual fault signals within the RF signal and outputting real fault signals, said discriminating means comprising:
      first detecting means for detecting a level of a first occurrence of the sensed RF signal;
      second detecting means for detecting a second occurrence of the sensed RF signal; and
      output means for outputting an actual fault signal only if the level of the first occurrence of the RF signal exceeds a predetermined level and if the second occurrence of the RF signal occurs within a predetermined time period; and
   detection means for testing the actual fault signal against a threshold.

6. A signal preprocessor for eliminating false fault signals, comprising:
   sensing means for sensing an RF signal;
   discriminating means for discriminating between false fault signals and actual fault signals within the RF signal and outputting real fault signals, said discriminating means comprising:
      actual input means for receiving a first RF signal;
      delayed input means for receiving a delayed second RF signal; and
      comparison means for comparing the received first RF signal and comparing the delayed second RF signal and outputting the actual fault signal when the received first RF signal exceeds a predetermined level and the delayed second RF signal occurs within a predetermined time period; and
   fault indication means for indicating an actual fault by testing the actual fault signal against a threshold.

* * * * *